United States Patent
Wang et al.

(10) Patent No.: US 7,573,736 B2
(45) Date of Patent: Aug. 11, 2009

(54) SPIN TORQUE TRANSFER MRAM DEVICE

(75) Inventors: Yu-Jen Wang, Hsinchu (TW); Denny Tang, Hsinchu (TW); Hsu-Chen Cheng, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 70 days.

(21) Appl. No.: 11/752,157

(22) Filed: May 22, 2007

(65) Prior Publication Data

US 2008/0291720 A1 Nov. 27, 2008

(51) Int. Cl.
*G11C 11/00* (2006.01)

(52) U.S. Cl. .................. 365/158; 365/171; 365/173

(58) Field of Classification Search .............. 365/158, 365/171, 173

See application file for complete search history.

(56) References Cited

U.S. PATENT DOCUMENTS

| 6,714,444 | B2 | 3/2004 | Huai et al. | |
|---|---|---|---|---|
| 6,950,290 | B2 * | 9/2005 | Hayashi et al. | 360/324.1 |
| 7,242,045 | B2 | 7/2007 | Nguyen et al. | |
| 7,286,395 | B2 | 10/2007 | Chen et al. | |
| 2007/0019341 | A1 * | 1/2007 | Mizuno et al. | 360/324.11 |

* cited by examiner

*Primary Examiner*—Huan Hoang
(74) *Attorney, Agent, or Firm*—Haynes and Boone, LLP

(57) ABSTRACT

The present disclosure provides a magnetic memory element. The memory element includes a magnetic tunnel junction (MTJ) element and an electrode. The electrode includes a pinning layer, a pinned layer, and a non-magnetic conductive layer. In one embodiment, the MTJ element includes a first surface having a first surface area, and the electrode includes a second surface. In the embodiment, the second surface of the electrode is coupled to the first surface of the MTJ element such that an interface area is formed and the interface area is less than the first surface area.

21 Claims, 5 Drawing Sheets

SPIN TORQUE TRANSFER MRAM DEVICE

BACKGROUND

The present disclosure relates generally to the field of nonvolatile memory devices, and more specifically to an element of a magnetic random access memory (MRAM) device that uses spin torque transfer.

MRAM is a nonvolatile memory technology that uses magnetization to represent stored data. MRAMs are beneficial in that they retain stored data in the absence of electricity. Generally, MRAM includes a plurality of magnetic cells in an array. Each cell typically represents one bit of data. Included in the cells are magnetic elements. A magnetic element may include two ferromagnetic "plates" (or layers upon a semiconductor substrate) each of which has a magnetization direction (or orientation of magnetic moments) associated with it. The two ferromagnetic plates are separated by a thin nonmagnetic layer.

More specifically, MRAM cells are often based on a magnetic tunnel junction (MTJ) element (also known as tunnel magnetoresistance (TMR) elements). An MTJ element includes at least three basic layers: a "free layer," a tunneling barrier layer, and a "pinned layer." The free layer and the pinned layer are ferromagnetic layers, the tunneling barrier layer is a thin insulator layer located between the free layer and the pinned layer. In the free layer, the magnetization direction is free to rotate; the magnetization of the pinned layer is not. An antiferromagnetic layer may be used to fix, or pin, the magnetization of the pinned layer in a particular direction. A bit is written to the element by changing the magnetization direction of one of the ferromagnetic plates of the magnetic element. Depending upon the orientations of the magnetic moments of the free layer and the pinned layer, the resistance of the MTJ element will change. Thus, the bit may be read by determining the resistance of the magnetic element. When the magnetization of the free layer and the pinned layer are parallel and the magnetic moments have the same polarity, the resistance of the MTJ element is low. Typically, this is designated a "0." When the magnetization of the free layer and the pinned layer are antiparallel (i.e. the magnetic moments have the opposite polarity), the resistance of the MTJ is high. Typically, this is designated a "1."

Spin torque transfer (STT) (also known as spin transfer switching or spin-transfer effect) is one technique for writing to memory elements. STT was developed as an alternative to using an external magnetic field to switch the direction of a free layer in the magnetic element. STT is based upon the idea that when a spin-polarized current (most of the electrons of the current have spins aligned in the same direction) is applied to a "free" ferromagnetic layer, the electrons may get repolarized on account of the orientation of the magnetic moments of the "free layer." The repolarizing of the electrons leads to the free layer experiencing a torque associated with the change in the angular momentum of the electrons as they are repolarized. As a result, if the current density is high enough, this torque has enough energy to switch the direction of the magnetization of the free layer. The advantages of using STT for writing to magnetic elements are known in the art and include smaller bit size, lower number of process steps as compared with other writing techniques, scalability for large arrays, and lower writing current requirement. However, there are also disadvantages to using STT for writing to magnetic elements, as the current density required to switch the direction of magnetization in a free layer in the magnetic element is quite large. The critical current density required to switch the layer is denoted as "Jc." In a conventional embodiment, Jc may be greater than $1E10^6$ A/cm$^2$.

As such, an improved magnetic element architecture allowing the use of STT is desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The present disclosure relates generally to MRAM and more particularly, to a spin torque transfer magnetic element. It is understood, however, that specific embodiments are provided as examples to teach the broader inventive concept, and one of ordinary skill in the art can easily apply the teaching of the present disclosure to other methods or apparatus. In addition, it is understood that the methods and apparatus discussed in the present disclosure include some conventional structures and/or processes. Since these structures and processes are well known in the art, they will only be discussed in a general level of detail. Furthermore, reference numbers are repeated throughout the drawings for sake of convenience and example, and such repetition does not indicate any required combination of features or steps throughout the drawings. Moreover, the formation of a first feature over and on a second feature in the description that follows may include embodiments in which the first and second features are formed in direct contact, and may also include embodiments in which additional features may be formed interposing the first and second features, such that the first and second features may not be in direct contact.

Figure 1:
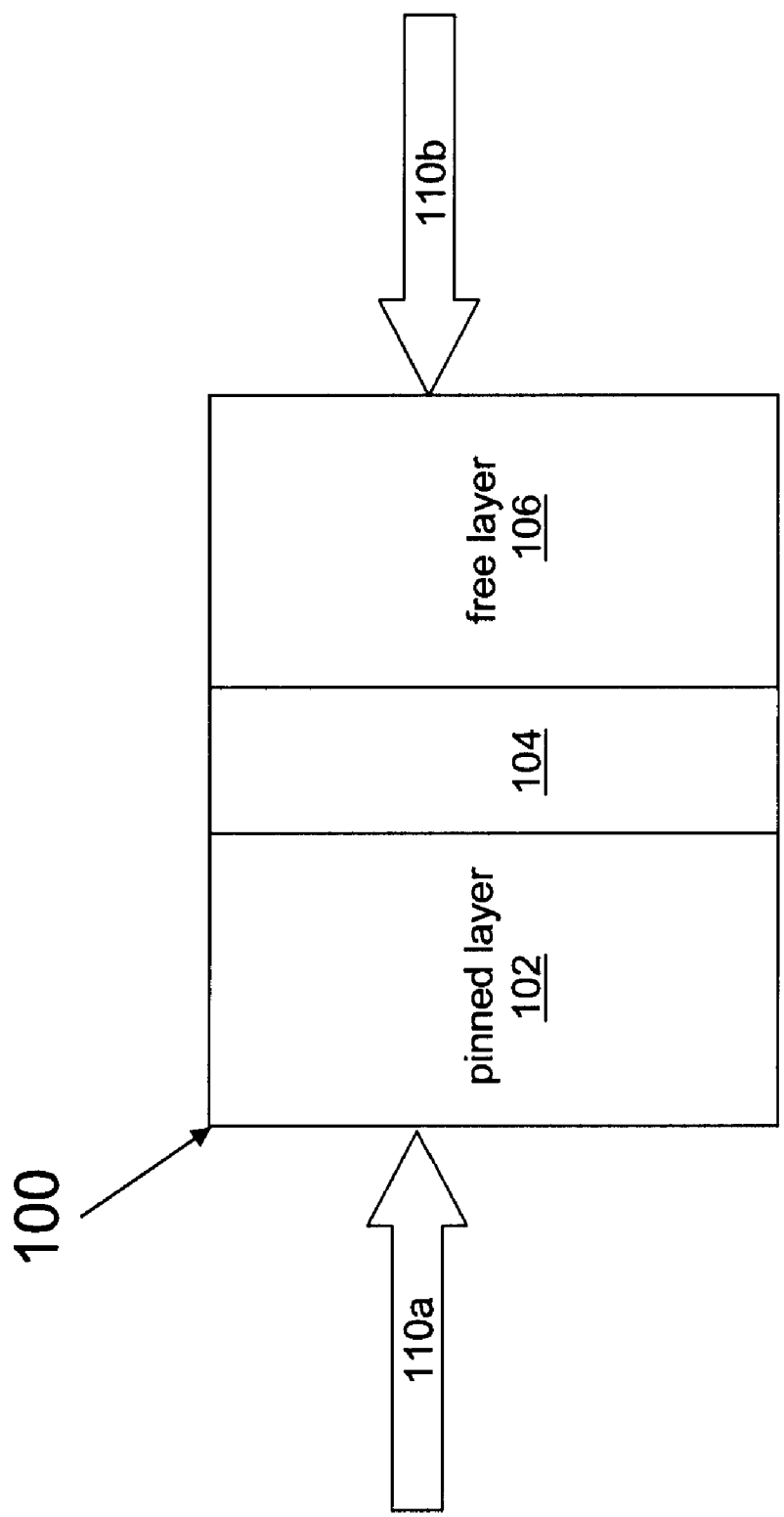
FIG. 1 is a cross-section illustrating an embodiment of a magnetic tunnel junction (MTJ) element.

Referring to FIG. 1, illustrated is an embodiment of a magnetic element 100. The magnetic element 100 includes a pinned layer 102 (also known as a reference layer), a barrier layer 104 (also known as tunneling barrier), and a free layer 106 (also known as a storage layer). The magnetic element 100 is a magnetic tunnel junction (MTJ) element as it has an insulator (the barrier layer 104) sandwiched between a free magnetic element (the free layer 106) and a fixed magnetic element (the pinned layer 102). The magnetic element 100 architecture allows the magnetization of the free layer to be switched using spin-torque transfer (STT). The following description of STT applied to the magnetic element 100 (as well as the general description included above) is based upon the current state of the art for reference only and not intended to be limiting the scope of the current disclosure. A current perpendicular to plane (CPP) configuration is described.

The magnetic moments of the free layer 106 are assumed initially antiparallel to the pinned layer 102. Current, illustrated as arrow 100b, can be supplied from the free layer 106 toward the pinned layer 102 to switch the magnetization of the free layer 106 to be parallel to the magnetization of the pinned layer 102. When current is driven from the free layer 106 to the pinned layer 102 (i.e. in the direction of arrow 100b), conduction electrons travel from the pinned layer 102 to the free layer 106. The majority electrons traveling from the pinned layer 102 have their spins polarized in the same direction as the magnetic moments of the pinned layer 102. These electrons interact with the magnetic moments of the free layer 106 near the interface between the free layer 106 and the barrier layer 104. Because of this interaction, the electrons transfer their spin angular momentum to the free layer 106. This spin angular momentum is anti-parallel to the magnetization of the free layer 106. If sufficient angular momentum is transferred by the electrons, the magnetization of the free layer 106 can be switched to be parallel to the magnetization of the pinned layer 102.

Alternatively, current can be supplied from the opposite direction, illustrated as arrow 110a, from the pinned layer 102 to the free layer 106. Current from the direction of arrow 100a switches the magnetization of the free layer 106 to be anti-parallel to the magnetization of the pinned layer 102. The magnetization of the free layer 106 is assumed parallel to the pinned layer 102 prior to applying the current. When the current is driven from the pinned layer 102 to the free layer 106, (i.e. in the direction of arrow 110a), conduction electrons travel in the opposite direction. The majority electrons have their spins polarized in the direction of the magnetization of the free layer 106 (i.e. same direction as the pinned layer 102). These majority electrons are transmitted through the pinned layer 102. However, the minority electrons, which have spins polarized antiparallel to the magnetization of the free layer 106 and the pinned layer 102, will be reflected from the pinned layer 102 and travel back to the free layer 106. The minority electrons reflected interact with the magnetic moments of the free layer 106 and transfer a portion of their spin angular momentum to the free layer 106. If sufficient angular momentum is transferred, the magnetization of the free layer 106 can be switched to be antiparallel to the magnetization of the pinned layer 102.

Thus, the barrier layer 104 is thin enough to allow the tunneling of electrons through it. The barrier layer 104 has a nonmagnetic composition and can be formed from any suitable material that may function as an electrical insulator. In an embodiment, the barrier layer 104 includes alumina. In an alternative embodiment, the barrier layer 104 includes MgO. Examples of other dielectric materials that may be included in the barrier layer 104 include oxides or nitrides of Al, Mg, Si, Hf, Sr, or Ti such as, $SiO_x$, $SiN_x$, $SiO_xN_y$, $AlO_x$, $TO_x$, $TiO_x$, $AlN_x$, and/or combinations thereof. The barrier layer 104 may be formed by conventional processes such as, photolithography, chemical vapor deposition (CVD), plasma enhanced chemical vapor deposition (PECVD), physical vapor deposition (PVD), electrochemical deposition, molecular manipulation, oxidation, etching, chemical mechanical polishing, and/or other processes known in the art. The barrier layer 104 may electrically insulate the pinned layer 102 from the free layer 106 independently, or in conjunction with other layers (not illustrated) interposing the pinned layer 102 and the free layer 106.

The pinned layer 102 and the free layer 106 are ferromagnetic layers. The pinned layer 102 and the free layer 106 may include Co, Fe, Ni, Mn, B, and/or their alloys, including for example, NiFe, NiFe, CoFe, CoFeB, or compounds thereof, including other ferromagnetic materials. The pinned layer 102 and/or the free layer 106 may be formed by conventional processes such as, photolithography, chemical vapor deposition (CVD), physical vapor deposition (PVD), electrochemical deposition, molecular manipulation, etching, chemical mechanical polish, and/or other processes. The pinned layer 102 and the free layer 106 are illustrated in FIG. 1 as single layers; however, as known in the art, either layer may be synthetic.

Figure 2:
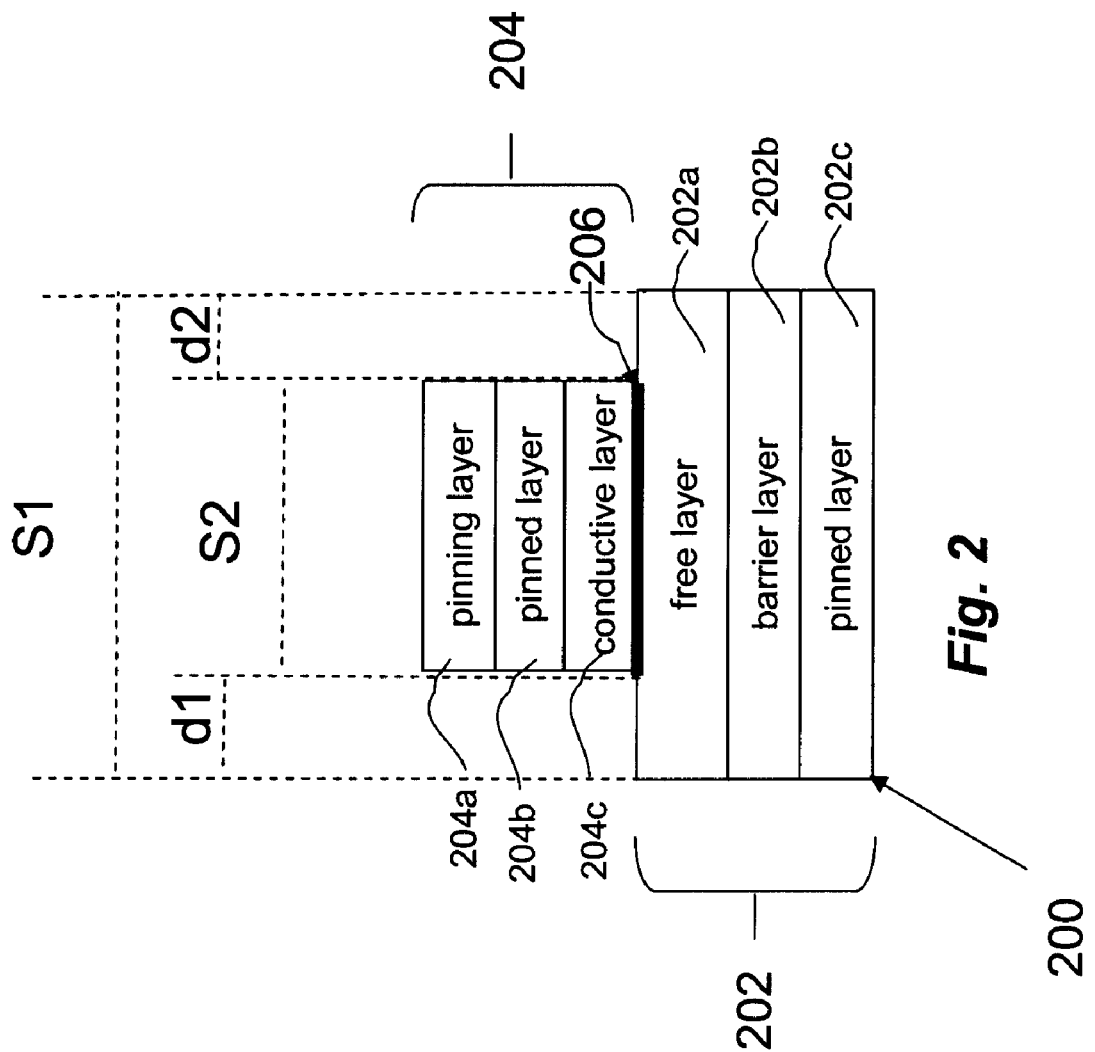
FIG. 2 is a cross-section illustrating an embodiment of a magnetic element including a MTJ and an electrode.

Referring now to FIG. 2, a magnetic element 200 is illustrated. The magnetic element 200 may be included in an MRAM device comprising an array of cells. The magnetic element 200 may be programmed using spin torque transfer (STT). The magnetic element 200 includes an MTJ element 202 and an electrode 204. The electrode 204 is a spin-polarizing electrode. The MTJ element 202 is substantially similar to the magnetic element 100 and may include layers having substantially similar compositions and fabrication methods as the magnetic element 100, described above with reference to FIG. 1.

The MTJ element 202 includes a free layer 202a, a barrier layer 202b, and a pinned layer 202c. The free layer 202a is substantially similar to the free layer 106, described above with reference to FIG. 1. The barrier layer 202b is substantially similar to the barrier layer 104, also described above with reference to FIG. 1. The free layer 202c is substantially similar to the free layer 102, also described above with reference to FIG. 1. The pinned layer 202c and the free layer 202a are illustrated as single ferromagnetic layers. However, as known in the art, any portion of the layers 202a and 202c may be synthetic. The MTJ element 202 may include or may be coupled to additional layers such as additional pinned layers, spacer layers, antiferromagnetic layers (or pinning layers), seed layers, capping layers, and/or other layers known in the art. One or more layers may be synthetic. In an embodiment, an antiferromagnetic layer is coupled to the pinned layer 202c. The antiferromagnetic layer can pin the magnetization of the adjacent magnetic layer by exchanging coupling. Therefore, the antiferromagnetic layer can set, or "pin" the direction of magnetization of the pinned layer 202c.

The electrode 204 includes a pinning layer 204a, a pinned layer 204b, and a non-magnetic, conductive layer 204c. The conductive layer 240c interposes the pinned layer 204b and the free layer 202a of the MTJ element 202. The conductive layer 204c may prevent electrical coupling and/or magnetic coupling (isolates magnetization) between the pinned layer 204b and the free layer 202a. As such, the conductive layer 204c may be an "insulator" layer between the pinned layer 204b and the free layer 202a. In an embodiment, the conductive layer 204c comprises Ta and/or TaN. Examples of other materials that may be included in the non-magnetic, conductive layer 204c include Ti, TiN, W, WN, Pt, metal silicides, metal nitrides, and/or conductive oxides. Examples of metal silicides include nickel silicide, cobalt silicide, tungsten silicide, tantalum silicide, titanium silicide, platinum silicide, erbium silicide, palladium silicide, and/or combinations thereof. Examples of a conductive oxide include NbO, ZnO, and/or combinations thereof. The thickness of the conductive layer 204c and the composition of the layer 204c should be optimized such that the magnetization of the free layer is increased and a lower Jc of the magnetic element 200 is provided. The conductive layer 204c may have a thickness no greater than approximately 600 A. In an embodiment, the thickness of the conductive layer 204c is approximately 500 A. The conductive layer 204c may be formed using conventional processes such as, photolithography, deposition, annealing, oxidation, etching, chemical mechanical polish, and/or other processes known in the art.

The pinned layer 204b is a ferromagnetic layer similar to the pinned layer 102, described above with reference to FIG. 1. The pinned layer 204b may include Co, Fe, Ni, Mn and/or their alloys, including for example, NiFe, NiFe, CoFe, or compounds thereof including other ferromagnetic materials. The pinned layer 104b may be formed by conventional processes such as, photolithography, chemical vapor deposition (CVD), physical vapor deposition (PVD), electrochemical deposition, molecular manipulation, etching, and/or other processes known in the art.

The pinning layer 204a is coupled to the pinned layer 204b. The pinning layer 204a is an antiferromagnetic layer. In an embodiment, the pinning layer 204a includes PtMn. Examples of other antiferromagnetic materials that may be included in the pinning layer 204a include NiMn, PdMn, and IrMn. The pinning layer 204a sets or "pins" the direction of magnetization of the pinned layer 204b. The pinning layer 204a may be formed by conventional processes such as, photolithography, chemical vapor deposition (CVD), physical vapor deposition (PVD), electrochemical deposition, molecular manipulation, etching, and/or other processes known in the art.

In the illustrated embodiment, the electrode 204 is coupled to the MTJ element 202 creating an interface area 206. The interface area 206 is the area of physical contact between (or the area of mating of, or the area of direct coupling of, or contact area) the electrode 204 and the MTJ element 202. In the illustrated embodiment, the interface area 206 includes the area of contact between the conductive layer 204c of the electrode 204 and the free layer 202a of the MTJ element 202. In other embodiments, it is possible that the interface area 206 include an area of contact between other layers of an electrode and an MTJ element.

The electrode 204 includes a surface, hereinafter described as a coupling surface. At least a portion of the coupling surface of the electrode 204 is physically coupled to the MTJ element 204. The coupling surface of the electrode 204 has a surface area S2. In the illustrated embodiment, the coupling surface of the electrode 204 is a surface of the conductive layer 204c. The MTJ element 202 also includes a surface, hereinafter described as a coupling surface. At least a portion of the coupling surface of the MTJ element 202 is physically coupled to the electrode 204. The coupling surface of the MTJ element 202 has a surface area S1. In the illustrated embodiment, the coupling surface of the MTJ element 202 is a surface of the free layer 202a.

In the illustrated embodiment, the interface area 206 is substantially equal to the surface area S2 of the electrode 204. The electrode 204 is coupled to the MTJ element 206 leaving an area d1 and an area d2 of the surface area S1 of the MTJ element 202 without direct physical coupling with the electrode 204. In an embodiment, the area d1 may be approximately equal to the area d2. In an alternative embodiment, the area d1 may be greater than or less than the area d2 as the electrode 204 is asymmetrically coupled to the coupling surface of the MTJ element 202. In an embodiment, the area d1 and/or the area d2 may be equal to zero. Further embodiments of the coupling of an electrode and an MTJ element are described in more detail below in reference to FIGS. 4a, 4b, and 4c.

The magnetic element 200 is configured such that it may use spin torque transfer to program the element. The electrode 204 is electrically coupled such that a current is provided through the electrode 204 to the MTJ element 202. The current through the electrode 204 becomes spin-polarized in the orientation of the pinned layer 204b. The current provided through the electrode 204 may be of sufficient current density to force the magnetic moments of the free layer 202a to rotate at and near the interface area 206. As the magnetic moments of the free layer 202a are coupled, when the magnetic moments at and near the interface area 206 begin to rotate, substantially all the magnetic moments of the layer will rotate. The current density of the provided current may be higher in the electrode 204 than the MTJ element 202 as the MTJ element 202 is larger than the electrode 204. As the current only has to rotate the magnetic moments at the interface area 206 as opposed to for example, the area S1, the current required to switch the free layer 202a, Jc, may be decreased from conventional magnetic elements.

Figure 3:
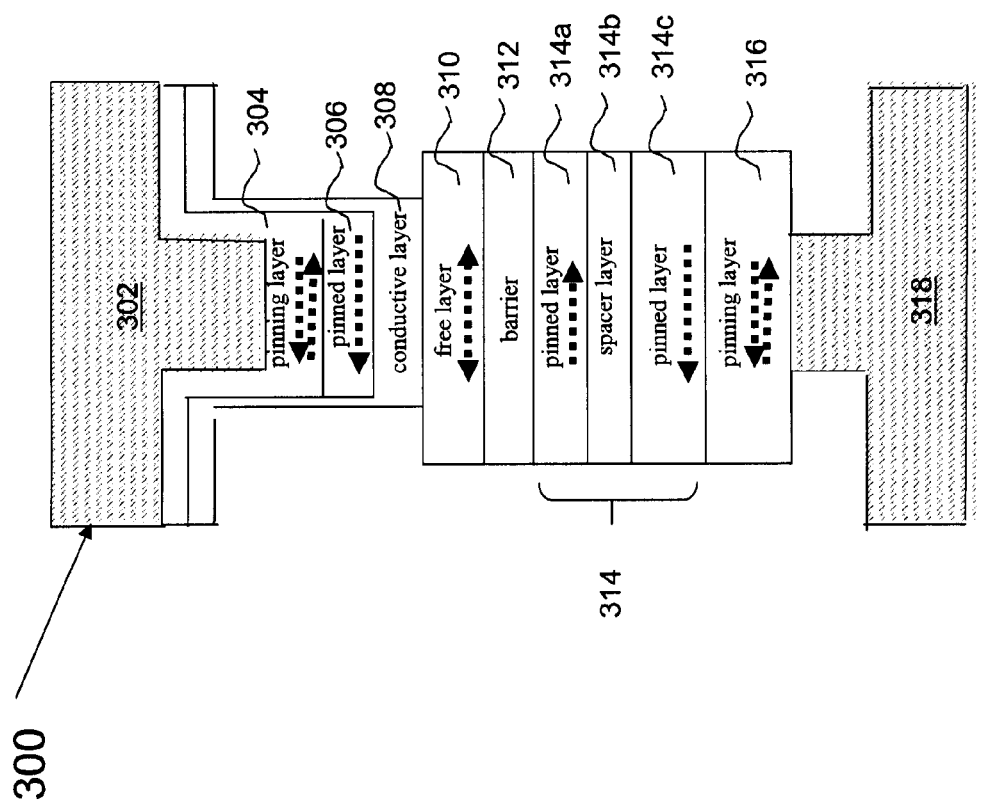
FIG. 3 is a cross-section illustrating an alternative embodiment of a magnetic element.

Referring now to FIG. 3, illustrated is cross-section of a magnetic element 300. The magnetic element 300 may be included in a cell of an MRAM device. The magnetic element 300 is configured such that it may be programmed using spin torque transfer (STT). The magnetic element 300 may be formed on a substrate such as a semiconductor substrate including for example, silicon, germanium, and/or a compound semiconductor material. The magnetic element 300 includes a first interconnect 302 and a second interconnect 322. The interconnects 302 and 322 may be formed of material suitable of conducting electricity, such as Al, Cu, Au, Ag, Ta, and/or combinations thereof. The interconnect 302 is operable to supply a current to the magnetic element 300. In an embodiment, the interconnect 322 and/or 302 may include a barrier layer. Examples of barrier layer materials include Ti, Ta, TiN, TaN, WN, and SiC.

An electrode is coupled to the interconnect 302; the electrode including a pinning layer 304, a pinned layer 306, and a non-magnetic, conductive layer 308. The pinning layer 304, the pinned layer 306, and the conductive layer 308 comprise a spin-polarizing electrode, substantially similar to electrode 204, described above with reference to FIG. 2. The electrode may be fabricated using conventional semiconductor processing such as photolithography, etching, deposition, and other processes known in the art. For example, in an embodiment, a via is etched providing contact to the stack of films comprising the magnetic tunnel junction, described below. The width of the etched via is smaller than the width of the magnetic tunnel junction in order to provide higher current density through the via. The non-magnetic conductive layer 308, the pinned layer 306, and the pinning layer 304 are successively deposited/grown in the etched via.

A magnetic tunnel junction (MTJ) element is coupled to the electrode. The illustrated MTJ element includes a free layer 310, a barrier layer 312, a synthetic pinned layer including pinned layer 314a, spacer layer 314b, and pinned layer 314c, and a pinning layer 316. The pinning layer 316 may include one or more antiferromagnetic layers. In an embodiment, the antiferromagnetic layer may be composed of PtMn. Examples of other antiferromagnetic materials that may be included in the antiferromagnetic layer include NiMn, PdMn, IrMn, and/or combinations thereof. In an embodiment, a seed layer may be included under the antiferromagnetic layer The synthetic pinned layer 314 includes two ferromagnetic layers 314a and 314c separated by the spacer layer 314b. The ferromagnetic layers 314a and 314c may include Co, Fe, Ni, and/or their ferromagnetic alloys such as NiFe, CoFe or CoNiFe. The layers may also comprise half metallic ferromagnets such as, $CrO_2$, NiMnSb, and/or PtMnSb. The spacer layer 314b includes a non-magnetic conductive material. In an embodiment, the spacer layer comprises Ru. Other examples of material that may be included in the spacer layer 314b include Ir and Re. The thickness of the spacer layer is such that the ferromagnetic layers 314a and 314c are antiferromagnetically coupled.

Adjacent the synthetic pinned layer 314 is the barrier layer 312. The barrier layer 312 is substantially similar to the barrier layer 202b described above with reference to FIG. 2. The barrier layer 314 is sandwiched between the synthetic pinned layer 314 and the free layer 310. The free layer 310 is substantially similar to the free layer 202a described above with reference to FIG. 2.

FIG. 3 also illustrates one embodiment of the magnetization of the layers of the magnetic element 300 (illustrated as arrows in each layer). The pinning layers 304 and 316 have magnetic moments in both directions in order to pin the adjacent layers as described above. The direction of the free layer 310 magnetization may be switched, including by the use of STT. The direction of magnetization of the pinned layer 306 is parallel to that of the pinned layer 314c (arbitrarily illustrated by an arrow pointing to the left). The pinned layer 314a has a magnetization that is opposite the magnetization of the pinned layer 306 and 314c (arbitrarily illustrated by an arrow pointing to the right). In an embodiment, the pinned layer 306 is subjected to magnetic annealing process to set the direction of the magnetization of the pinned layer 306. In the magnetic annealing process, the heating and slow cooling of the pinned layer 306 in the presence of a magnetic field can create an easy axis of magnetization parallel to the applied magnetic field.

The magnetic element 300 and/or the magnetic element 200 may include other layers and/or the illustrated layers may be removed. For example, additional seed layers or capping layers may be present in the magnetic elements 300 and 200 that are not illustrated. As a further example, the disclosed coupling of an electrode and magnetic element may be combined with other magnetic architectures, such as dual spin filter (DSF) architectures. In addition, the disclosed coupling of an electrode and magnetic element may include architectures other than MTJ such as, giant magnetoresistance (GMR) magnetic elements.

Figure 4B:
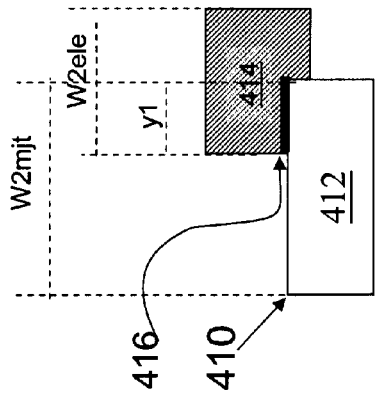
FIGS. 4a, 4b, and 4c are cross-sections of magnetic elements illustrating three embodiments of coupling an MTJ element and an electrode.
Figure 4C:
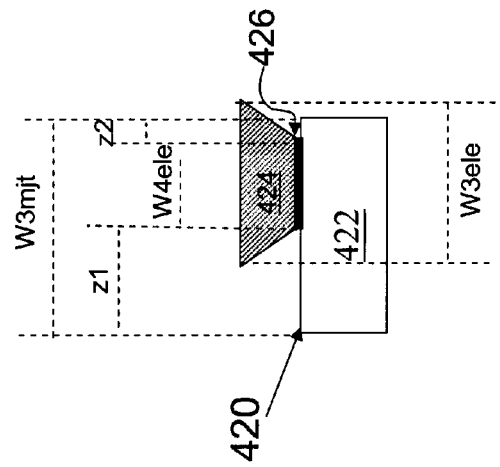
Figure 4A:
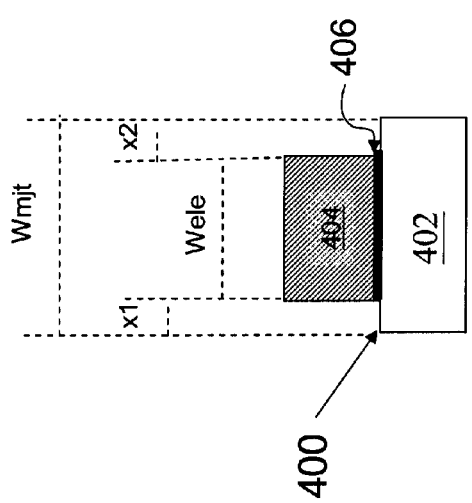

Referring now to FIGS. 4a, 4b, and 4c, a plurality of memory elements are illustrated. The memory elements 400, 410, and 420 illustrate example architectures of the coupling of an electrode and a magnetic element. The figures are examples only and not intended to be limiting. The memory element 400 includes a magnetic element 402 and an electrode 404; the memory element 410 includes a magnetic element 412 and an electrode 414; the memory element 420 includes a magnetic element 422 and an electrode 424. The magnetic elements 402, 412, and/or 422 may be substantially similar to the MTJ element 202 and/or the MTJ element of the magnetic element 300, described above with reference to FIG. 2 and FIG. 3 respectively. The electrodes 404, 414, and/or 414 may be substantially similar to the electrode 204 and/or the electrode of magnetic element 300, described above with reference to FIG. 2 and FIG. 3 respectively. The magnetic elements 402, 412, and 422 each include a surface, hereinafter described as a coupling surface, a portion of which is physically coupled (or directly coupled, mated to, providing physical contact) to the electrodes 404, 414, and 424 respectively. The electrodes 404, 414, and 424 each include a surface, hereinafter described as a coupling surface, a portion of which is physically coupled to the magnetic elements 402, 412, and 422 respectively.

FIG. 4a illustrates the electrode 404 coupled to the magnetic element 402 such that an interface area 406 is formed. More specifically, a coupling surface of the magnetic element 402 is mated to a coupling surface of the electrode 404 such that the interface area 406 is formed. The coupling surface of the electrode 404 has a surface area of Wele. The coupling surface of the magnetic element 402 has a surface area of Wmtj. In the illustrated embodiment, the interface area 406 includes the surface area Wele. The surface area Wmtj of the coupling surface of the magnetic element 402 includes areas x1 and x2 that are not physically coupled to the electrode 404. The areas x1 and x2 may be equal to one another, different from one another, and/or equal to zero in various embodiments.

FIG. 4b illustrates a coupling of the magnetic element 412 and the electrode 414 wherein the electrode 414 is coupled asymmetrically with the magnetic element 412. The magnetic element 412 includes a surface area W2mtj that is the surface area of a coupling surface of the magnetic element 412. The electrode 414 includes a surface area W2ele that is the surface area of a coupling surface of the electrode 414. The coupling surface of the magnetic element 412 is mated to the coupling surface of the electrode 414 such that an interface area 416 is formed. The interface area 416 is less than the surface area W2ele of the coupling surface of the electrode 412 as a portion of the surface area W2ele is not physically coupled to the magnetic element 412, shown as area y1. The interface area 416 is less than the surface area W2mtj of the magnetic element 412.

FIG. 4c illustrates a coupling of the magnetic element 422 and the electrode 424. The electrode 424 is a tapered electrode having a first surface with a surface area W3ele and a second surface with a surface area W4ele that is parallel the first surface. The surface area W4ele is smaller than the surface area W3ele. The surface area W4ele is also the surface area of the coupling surface of the electrode 424. The coupling surface of the magnetic element 422 is mated to the coupling surface of the electrode 424 such that an interface area 426 is formed. The interface area 426 is approximately equal to the surface area W4ele of the electrode 424. In an alternative embodiment, the interface area 426 may be smaller than the surface area W3mtj, such as if the electrode 424 is asymmetrically coupled as illustrated in FIG. 4b. The interface area 426 is less than the coupling surface area W3mtj of the magnetic element 422 as a portion of the surface area W3mtj is not physically coupled to the magnetic element 422, shown as areas z1 and z2. The areas z1 and z2 may be equal to one another, different from one another, and/or equal to zero in various embodiments.

Figure 5:
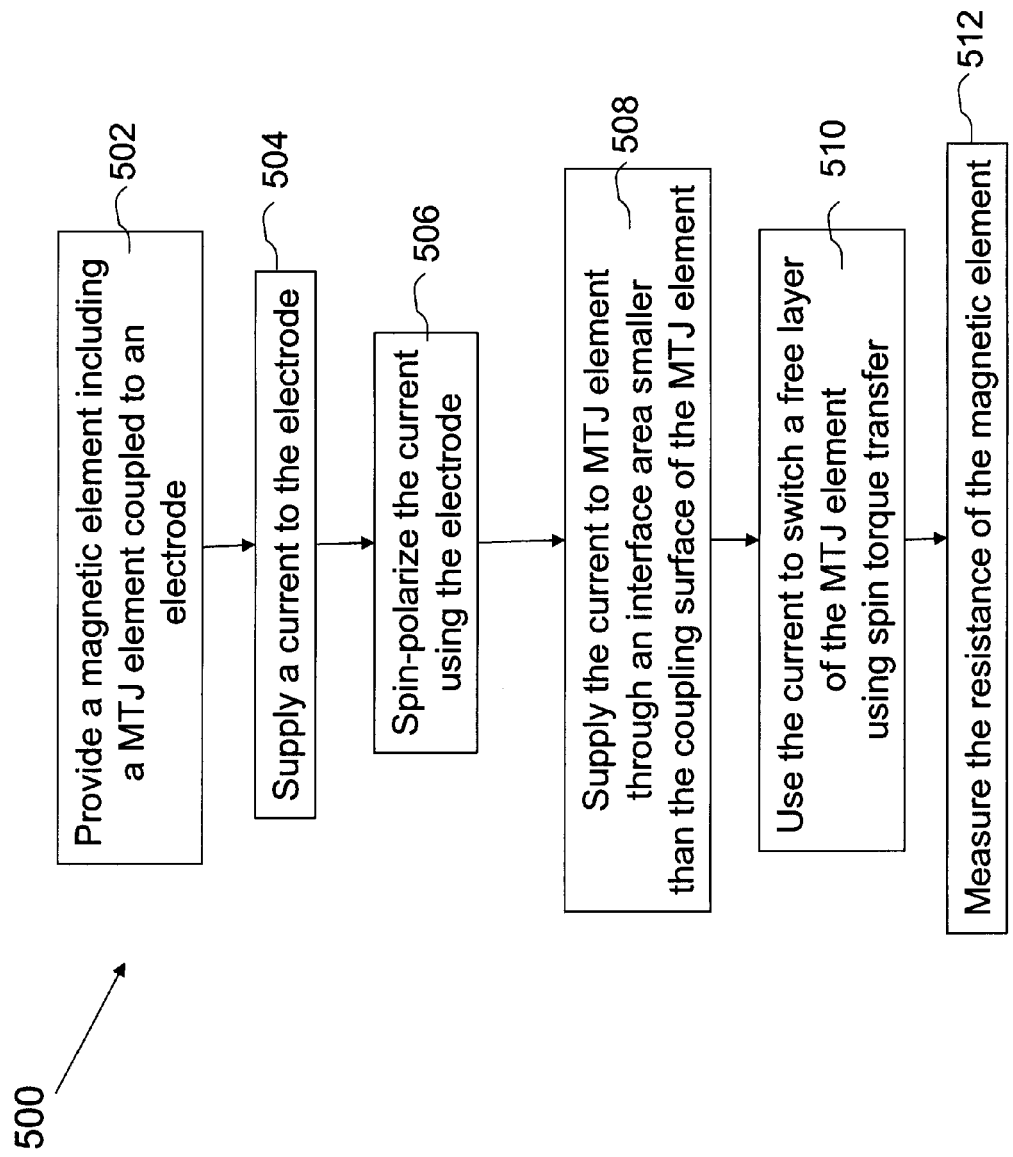
FIG. 5 is a flowchart illustrating an embodiment of a method of programming a magnetic element.

Referring now to FIG. 5, an embodiment of a method 500 of programming a magnetic element is illustrated. The method 500 begins at step 502 where a magnetic element is provided. The magnetic element includes a magnetic tunnel junction (MTJ) element coupled to an electrode. The magnetic element provided may be the magnetic element 200, 300, 400, 410, and/or 420, described above with reference to FIGS. 2, 3, 4a, 4b, and 4c respectively. The magnetic element may be one element included in an array of elements in an MRAM device. The method 500 then proceeds to step 504 where a current is supplied to the electrode of the magnetic element. The method then proceeds to step 506 where the current is spin-polarized by the electrode. The electrode may include a pinning layer and a pinned layer to polarize the current. The electrode may also include a conductive layer that is coupled to the magnetic tunnel junction element. The method then continues to step 508 where the current, now spin-polarized, is supplied to the MTJ element. The current is supplied to the MTJ element through an interface area. The interface area includes the area of physical coupling, or mating, between a coupling surface of the electrode and a coupling surface of the MTJ element. The interface area has a smaller surface area than the coupling surface of the MTJ element. In an embodiment, the electrode is smaller in width than the MTJ element providing a higher current density in the electrode than the MTJ element. This provides a higher current density at the interface area than the remainder of the MTJ element. In step 510, the current at the interface area has a current density greater than Jc, and as such, switches the magnetization of the free layer of the MTJ element using spin torque transfer.

The method 500 then proceeds to step 512 where the magnetic element is read. The magnetic element may be read by providing a read current to measure the resistance of the magnetic element. In an embodiment, the current (provided in step 504) switches the magnetization of a free layer to be parallel the magnetization of a pinned layer in the MTJ element in step 510 and the resistance measured is low. In an embodiment, the current (provided in step 504) switches the magnetization of a free layer to be antiparallel the magnetization of a pinned layer in the MTJ element in step 510 and the resistance measured is high. The resistance measured in step 512 may correspond to the data type stored by the magnetic element, for example, a low resistance may indicate a "0" was stored, a high resistance may indicate a "1" was stored.

Although only a few exemplary embodiments of this invention have been described in detail above, those skilled in the art will readily appreciate that many modifications are possible in the exemplary embodiments without material departing from the novel teachings and advantages of this disclosure.

Thus, the present disclosure provides a magnetic memory element. The memory element includes a magnetic tunnel junction (MTJ) element and an electrode. The electrode includes a pinned layer, a pinning layer, and a non-magnetic conductive layer.

Also provided is a method of forming a magnetic memory element. The method provides a substrate. A magnetic tunnel junction (MTJ) element is formed on the substrate. An electrode is formed on the substrate coupled to the MTJ element. The electrode includes forming a pinning layer, a pinned layer, and a non-magnetic conductive layer.

Also provided is a method of programming a magnetic memory element. A memory element is provided. The memory element includes an electrode coupled to a magnetic tunnel junction (MTJ) element. The MTJ element includes a free layer. A current is supplied to the electrode. The electrode is used to spin-polarize the current. The spin-polarized current from the electrode is supplied to the MTJ element through an interface area between the electrode and the MTJ element. The current supplied is sufficient to switch the free layer's magnetization direction.

What is claimed is:

1. A magnetic memory element comprising:
   a magnetic tunnel junction (MTJ) element including at least one free layer; and
   an electrode including a pinning layer, a pinned layer, and a non-magnetic conductive layer;
   wherein the non-magnetic conductive layer of the electrode interposes between the pinned layer of the electrode and the free layer of the MTJ element.

2. The memory element of claim 1, wherein the electrode contacts the MTJ element at a contact area, such that the contact area is smaller than a cross section of the MTJ element.

3. The memory element of claim 2, wherein the MTJ element further comprises an antiferromagnetic layer.

4. The memory element of claim 2, wherein a magnetization of the free layer is switched by spin-torque transfer.

5. The memory element of claim 1, wherein the pinned layer of the electrode has a magnetization direction set by a magnetic anneal process.

6. The memory element of claim 1, wherein the non-magnetic conductive layer includes a material chosen from the group consisting of Ti, TiN, Ta, TaN, W, WN, Pt, metal silicide, metal nitride, and conductive oxide.

7. The memory element of claim 1, wherein the non-magnetic, conductive layer is less than about 600 A thick.

8. The memory element of claim 1, wherein the MTJ element includes a first surface having a first surface area, and the electrode includes a second surface, the second surface of the electrode being coupled to the first surface of the MTJ element such that an interface area is formed, wherein the interface area is less than the first surface area.

9. The memory element of claim 8, wherein the second surface includes a surface of a non-magnetic, conductive layer.

10. The memory element of claim 8, wherein the interface area is substantially centered on the first surface area.

11. The memory element of claim 8, wherein a portion of the second surface of the electrode is not directly coupled to the first surface area.

12. The memory element of claim 8, wherein the first surface includes a surface of a free layer.

13. The memory element of claim 1, wherein the electrode is coupled to an interconnect operable to provide a current to the magnetic element.

14. The device of claim 1, wherein the MTJ element further includes a tunneling barrier layer and a second pinned layer.

15. A method of forming a magnetic memory element comprising:
    providing a substrate;
    forming a magnetic tunnel junction (MTJ) element on the substrate; and
    forming an electrode on the substrate coupled to the MTJ element, wherein the forming the electrode comprises forming at least one each of a pinning layer, a pinned layer, and a non-magnetic, conductive layer.

16. The method of claim 15, wherein the forming the electrode includes forming a via providing contact to the MTJ element, the via having a first width and the MTJ element having a second width, wherein the first width is less than the second width.

17. The method of claim 15, wherein the forming the MTJ element includes forming a free layer; and wherein the forming of the non-magnetic, conductive layer is such that the formed non-magnetic, conductive layer prevents magnetic coupling of the pinned layer and the free layer.

18. The method of claim 15, wherein the forming the electrode includes forming a tapered electrode.

19. A method of programming a magnetic memory element comprising:
    providing a memory element comprising an electrode coupled to a magnetic tunnel junction (MTJ) element, the MTJ element including a free layer;
    supplying a current to the electrode;
    using the electrode to spin-polarize the current; and
    supplying the spin-polarized current from the electrode to the MTJ element through an interface area between the electrode and the MTJ element, wherein the current supplied is sufficient to switch the free layer's magnetization direction.

20. The method of claim 19, wherein the using the electrode to spin-polarize the current comprises passing the current through a pinned layer and a non-magnetic conductive layer of the electrode.

21. The method of claim 19, wherein the current includes a first current density in the electrode and a second current density in the MTJ element, the first current density being greater than the second current density.

* * * * *